United States Patent
Takayama

(10) Patent No.: US 10,423,484 B2
(45) Date of Patent: Sep. 24, 2019

(54) MEMORY CONTROLLER, MEMORY SYSTEM, AND CONTROL METHOD

(71) Applicant: Toshiba Memory Corporation, Tokyo (JP)

(72) Inventor: Atsushi Takayama, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 88 days.

(21) Appl. No.: 15/690,255

(22) Filed: Aug. 29, 2017

(65) Prior Publication Data

US 2018/0276069 A1 Sep. 27, 2018

(30) Foreign Application Priority Data

Mar. 22, 2017 (JP) ................. 2017-056572

(51) Int. Cl.
| | | |
|---|---|---|
| *G06F 11/00* | (2006.01) | |
| *G06F 11/10* | (2006.01) | |
| *G06F 12/02* | (2006.01) | |
| *H03M 13/11* | (2006.01) | |
| *G11C 29/52* | (2006.01) | |
| *G11C 11/56* | (2006.01) | |

(52) U.S. Cl.
CPC ...... *G06F 11/1068* (2013.01); *G06F 11/1012* (2013.01); *G06F 12/0246* (2013.01); *G06F 2212/7205* (2013.01); *G11C 11/5642* (2013.01); *G11C 29/52* (2013.01); *H03M 13/1111* (2013.01)

(58) Field of Classification Search
None
See application file for complete search history.

(56) References Cited

U.S. PATENT DOCUMENTS

| | | | |
|---|---|---|---|
| 8,250,437 B2 | 8/2012 | Sakurada et al. | |
| 8,976,586 B2 | 3/2015 | Nagai et al. | |
| 9,329,935 B2* | 5/2016 | Cohen ................. | G06F 11/1076 |
| 9,337,865 B2 | 5/2016 | Cohen et al. | |
| 2011/0268019 A1* | 11/2011 | Tang ..................... | H04L 1/0048 |
| | | | 370/328 |

(Continued)

FOREIGN PATENT DOCUMENTS

| | | |
|---|---|---|
| JP | 2009-157836 A | 7/2009 |
| JP | 2013-021461 A | 1/2013 |

*Primary Examiner* — Daniel F. McMahon
(74) *Attorney, Agent, or Firm* — Kim & Stewart LLP

(57) ABSTRACT

A memory controller includes an encoder, a randomizer circuit, a program interface, a conversion circuit, and a decoder. The encode is configured to generate parity from input data. The randomizer circuit is configured to generate first and second data portions using a first random number, the input data, and parity. The program interface is configured to write the first and second data portions to a nonvolatile memory. The reading interface is configured to read data from the nonvolatile memory. The conversion circuit is configured to convert read data into an LLR sequence. Each LLR of the LLR sequence is generated based on a value of one bit of the read data and a value of a corresponding bit of a second random number that is equal to the first random number. The decoder is configured to decode the LLR sequence to generate output data corresponding to the input data.

16 Claims, 5 Drawing Sheets

(56) References Cited

U.S. PATENT DOCUMENTS

| | | | |
|---|---|---|---|
| 2014/0281762 A1* | 9/2014 | Norrie | G06F 11/2215 |
| | | | 714/703 |
| 2014/0281828 A1* | 9/2014 | Micheloni | G06F 11/00 |
| | | | 714/773 |
| 2015/0092886 A1* | 4/2015 | Ionita | H04L 25/4917 |
| | | | 375/298 |
| 2016/0328287 A1* | 11/2016 | Kim | G11C 11/5642 |
| 2017/0126360 A1* | 5/2017 | Millar | H04L 1/0045 |
| 2017/0262334 A1* | 9/2017 | Uchikawa | G11C 16/10 |

* cited by examiner

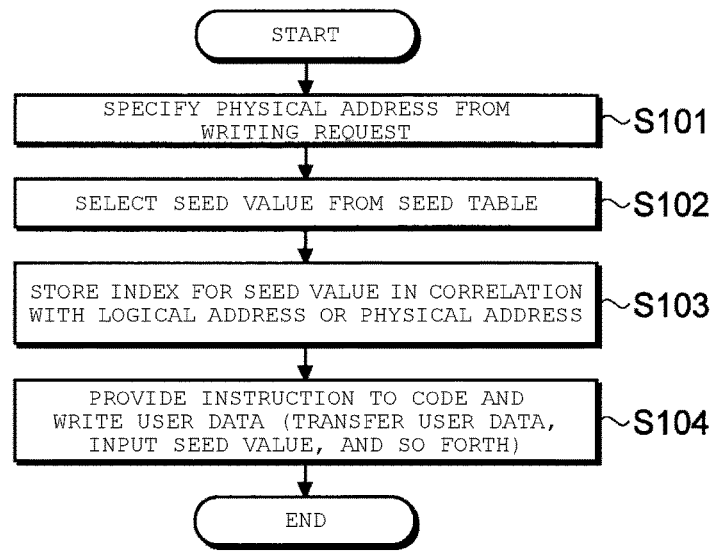
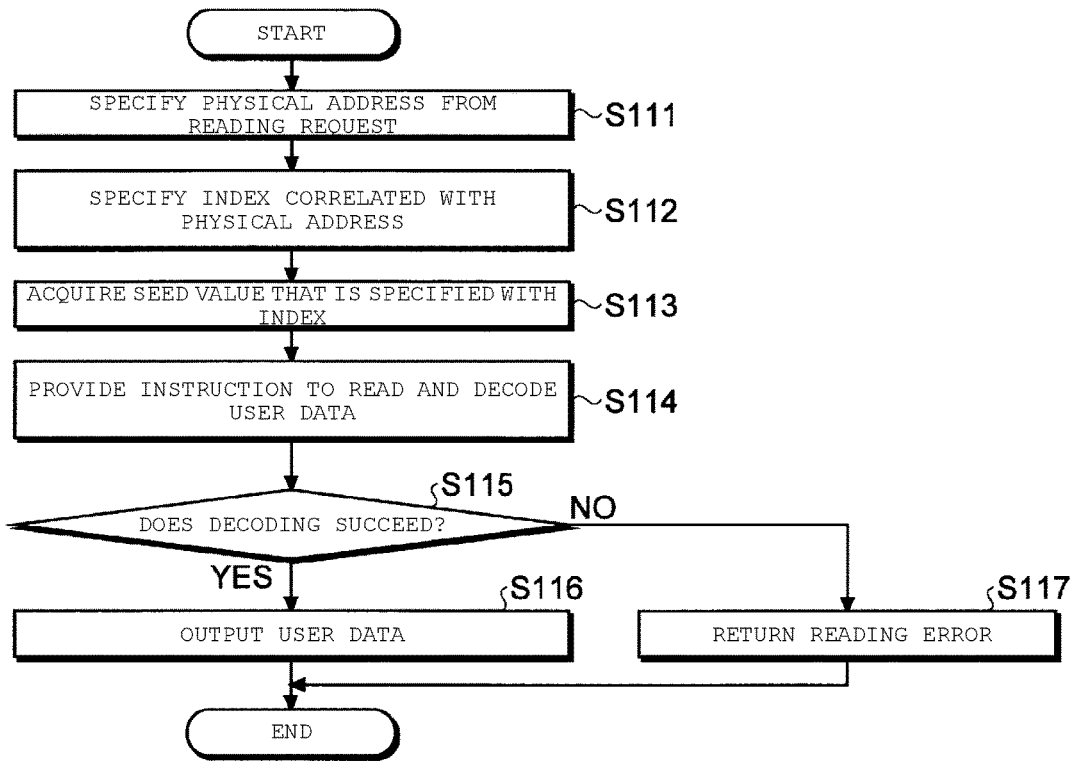

FIG. 8

| DATA VALUE | | | RANDOM NUMBER VALUE | LLR |
|---|---|---|---|---|
| HB | SB1 | SB2 | | |
| 0 | 0 | 0 | 0 | +3 |
| 0 | 0 | 0 | 1 | -3 |
| 0 | 0 | 1 | 0 | +1 |
| 0 | 0 | 1 | 1 | -1 |
| 0 | 1 | 0 | 0 | +6 |
| 0 | 1 | 0 | 1 | -6 |
| 0 | 1 | 1 | 0 | +9 |
| 0 | 1 | 1 | 1 | -9 |
| 1 | 0 | 0 | 0 | -3 |
| 1 | 0 | 0 | 1 | +3 |
| 1 | 0 | 1 | 0 | -1 |
| 1 | 0 | 1 | 1 | +1 |
| 1 | 1 | 0 | 0 | -6 |
| 1 | 1 | 0 | 1 | +6 |
| 1 | 1 | 1 | 0 | -9 |
| 1 | 1 | 1 | 1 | +9 |

MEMORY CONTROLLER, MEMORY SYSTEM, AND CONTROL METHOD

CROSS-REFERENCE TO RELATED APPLICATION

This application is based upon and claims the benefit of priority from Japanese Patent Application No. 2017-056572, filed Mar. 22, 2017, the entire contents of which are incorporated herein by reference.

FIELD

Embodiments described herein relate generally to a memory controller, a memory system, and a control method.

BACKGROUND

In the related art, a semiconductor memory device that includes a memory cell that stores an amount of charge in accordance with a data value is known. In this semiconductor memory device, a data value that is stored in the memory cell is determined based on a relationship between a threshold voltage of the memory cell and a reading voltage.

DESCRIPTION OF THE DRAWINGS

FIG. 4 is a flowchart illustrating an example of coding processing according to the first embodiment.

FIG. 5 is a flowchart illustrating an example of decoding processing according to the first embodiment.

FIG. 8 is a diagram illustrating an example of an LLR conversion table according to the second embodiment.

DETAILED DESCRIPTION

Figure 1:
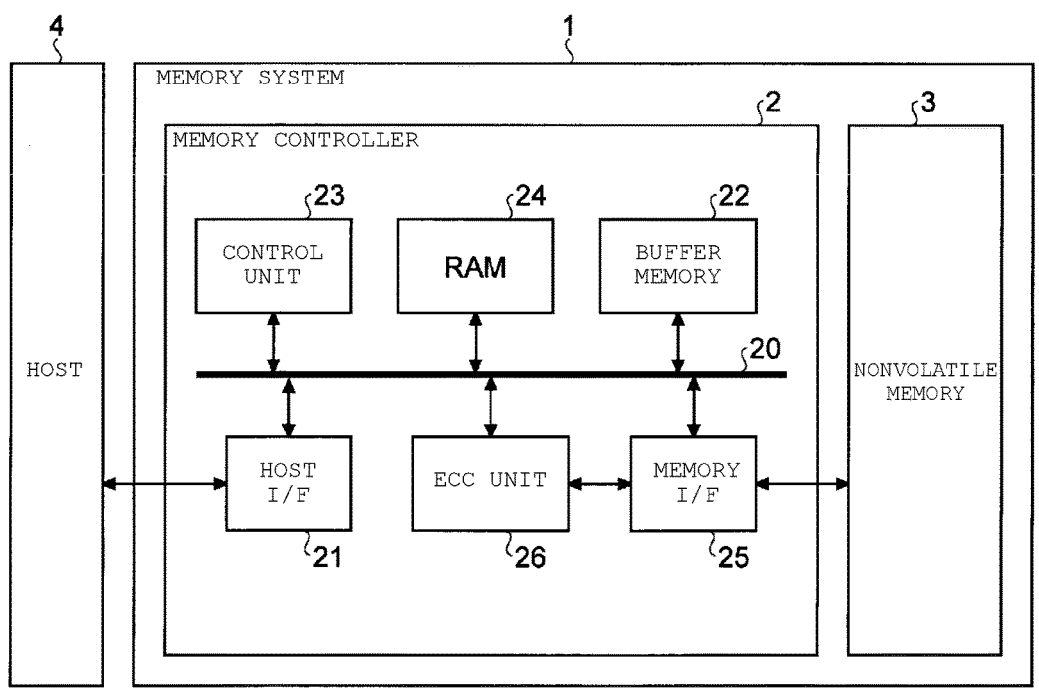
FIG. 1 is a block diagram illustrating an example of a schematic configuration of a memory system according to a first embodiment.

Embodiments provide a memory controller, a memory system, and a control method that are capable of improving the reliability thereof.

In general, according to one embodiment, there is provided a memory controller including an encoder configured to generate a parity from input data, a randomizer circuit configured to generate a first data portion using a first random number and the input data, and a second data portion using the first random number and the parity, a program interface configured to receive the first data portion and the second data portion from the randomizer circuit and write the first data portion and the second data portion to a nonvolatile memory, a reading interface configured to read data from the nonvolatile memory, a conversion circuit configured to receive from the reading interface, read data that the reading interface read from the nonvolatile memory, and convert the read data into a log likelihood ratio (LLR) sequence containing a sequence of LLRs, each LLR in the sequence being generated based on a combination of a value of one of the bits of the read data and a value of a corresponding bit of a second random number, and a decoder configured to decode the LLR sequence to generate output data. User data that is stored in the nonvolatile memory as part of a codeword is restored from the codeword by reading the codeword from the nonvolatile memory with the reading interface and setting the second random number to be equal to the first random number.

A memory controller, a memory system, and a control method according to embodiments will be described in detail below with reference to the accompanying drawings. It should be noted that the following embodiments are not limiting and the claimed scope may cover other embodiments.

Generally, in a NAND cell flash memory (hereinafter referred to as a NAND memory), the use of an element device, such as an oxide film, which is part of a memory cell, causes the element device to deteriorate over time, and a bit error may occur when reading. Accordingly, normally, in order to increase the reliability of the NAND cell flash memory, an error correction code is used.

Correction processing operations of the error correction code (the correction processing is hereinafter called decoding) are broadly categorized into two types according to information that is used when decoding. In the present description, one of the two types is called hard decision decoding and the other is called soft decision decoding. Input data to a decoder is binary data in hard decision decoding. In soft decision decoding, a likelihood value indicating a ratio between the likelihood of a bit being "0" and the likelihood of a bit being "1" is input to the decoder.

As the likelihood value, generally, a log likelihood ratio (LLR) that is expressed by Equation (1) below is used. In Equation (1), $x_i$ denotes an i-th writing bit, and $y_i$ denotes an i-th reading bit. Furthermore, $L_i$ is a log likelihood ratio for an i-th bit. P(x|y) is a conditional probability, and for example, is a value that can be calculated with a threshold voltage distribution of the NAND cell flash memory or an error rate.

$$L_i = \log \frac{p(x_i = 0 \mid y_i)}{p(x_i = 1 \mid y_i)} \quad (1)$$

In a control system of this NAND memory, for the purpose of increasing the reliability of the NAND flash memory, in some cases, randomizing of writing target data (hereinafter referred to as write data) is performed when writing. In the randomizing of the write data, for example, exclusive OR (XOR) between random data that is output from a pseudo-random number generator, such as a linear feedback shift register (LFSR), and the write data is performed. When reading, the randomizing that is performed on the write data is canceled using the same random data as when writing.

However, the difficulty is to integrate a configuration, in which the entire write data is randomized, into a system that is equipped with an error correction function in compliance with a soft decision scheme, such as low-density parity-check (LDPC). The reason for this that in order to error-correct the randomized data, there is a need to cancel the randomizing before error correction, but that the cancellation of the randomizing causes an arrangement of pieces of data within the NAND memory and an arrangement of pieces of data in a randomizing-canceled state to be inconsistent with each other and as a result, there is a likelihood that intended error correction will not be performed in the error correction in compliance with the soft decision scheme.

To deal with this problem, for example, a method is considered in which in an information portion and a parity portion that constitute the write data, the writing is performed on the NAND memory in a state where only the information portion is randomized and the parity portion is prevented from being a randomizing target. In this method, the randomizing of the information portion may be canceled after the error correction of read data. However, in this method, because the parity portion is prevented from being the randomizing target, ideal randomizing performance cannot be obtained, and thus there is a likelihood that the reliability will be decreased.

Accordingly, in the following embodiment, a memory controller, a memory system, and a control method that are capable of improving the reliability much more by setting the parity portion, as well as the information portion, as randomizing targets will be described using specific examples thereof.

First Embodiment

FIG. 1 is a block diagram illustrating an example of a schematic configuration of a memory system according to the first embodiment. As illustrated in FIG. 1, a memory system 1 according to the present embodiment includes a memory controller 2 and a nonvolatile memory 3. The memory system 1 can connect to the host 4. FIG. 1 illustrates a state where the memory system 1 is connected to the host 4. The host 4, for example, maybe an electronic apparatus, such as a personal computer or a portable terminal.

The nonvolatile memory 3 is a nonvolatile memory that stores data in a nonvolatile manner. In the present embodiment, the NAND memory is an example of the nonvolatile memory 3. It should be noted that the nonvolatile memory 3 is not limited to the NAND memory. Various nonvolatile memories may be employed as the nonvolatile memory 3. Writing (also referred to as programming) and reading to and from the nonvolatile memory 3 are performed per data unit called a page. Furthermore, erasing from the nonvolatile memory 3 is performed per block which includes a plurality of pages. The nonvolatile memory 3 includes a plurality of word lines and a plurality of bit lines that intersect in a vertically-separated state, and a plurality of memory cells that are provided at intersections, respectively, between the plurality of word lines and the plurality of bit lines.

In the present description, a plurality of memory cells that are connected to one word line are defined as a memory cell group. In a case where each memory cell is a single level cell (SLC), the memory cell group corresponds to one page. In a case where each memory cell is a multi-level cell (MLC), the memory cell group corresponds to a plurality of pages. For example, in a case where each memory cell is an MLC which can store two-bit information, the memory cell group corresponds to two pages. Furthermore, in a case where each memory cell is an MLC which can store three-bit data (which is referred to a triple level cell (TLC)), the memory cell group corresponds to three pages.

The memory controller 2 controls writing to the nonvolatile memory 3 according to a writing request from the host 4. Furthermore, the memory controller 2 controls reading from the nonvolatile memory 3 according to a reading request from the host 4. The memory controller 2 includes a host interface (I/F) 21, a memory interface (I/F) 25, a control unit 23, an error check and correction (ECC) unit 26 (a coding processing unit) 26, and a buffer memory 22. The host I/F 21, the memory I/F 25, the control unit 23, the RAM 24, the buffer memory 22, and the ECC unit 26 are connected to each other through the internal bus 20.

The host I/F 21 outputs the writing request (and any associated user data) and the reading request, which are received from the host 4, and the like to the internal bus 20. Furthermore, the host I/F 21 transmits user data that is read and restored from the nonvolatile memory 3, a response from the control unit 23, and the like to the host 4.

Based on an instruction of the control unit 23, the memory I/F 25 performs writing processing that writes data or the like to the nonvolatile memory 3, and reading processing that read data or the like from the nonvolatile memory 3.

The ECC unit 26 not only generates an error correction parity by coding the user data, but also generates a codeword that includes randomized user data (hereinafter referred to as an information portion) and coded parity of the user data (hereinafter referred to as a parity portion). At this point, the codeword that is generated by the ECC unit 26 in the present embodiment has two portions that are randomized using a random number or a pseudo-random number. Furthermore, the ECC unit 26 decodes a codeword that is read from the nonvolatile memory 3 to thereby restore the user data.

Figure 2:
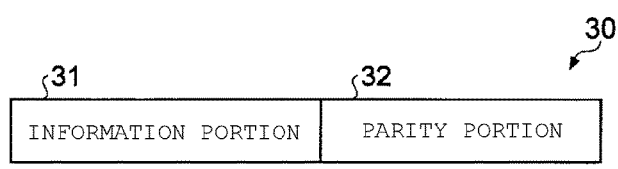
FIG. 2 is a diagram illustrating an example of an ECC frame according to the first embodiment.

In the present description, data of a predetermined size, which constitutes the codeword, is called an error correcting code (ECC) frame. FIG. 2 is a diagram illustrating an example of an ECC frame according to the present embodiment. As illustrated in FIG. 2, an ECC frame 30 includes an information portion 31 in which one portion or all portions of the user data are stored, and a parity portion 32 in which a parity for error-correcting data within the information portion 31 is stored. It is noted that as described above, because the codeword in the present embodiment is randomized, each of the data that is stored in the information portion 31 and the parity that is stored in the parity portion 32 is randomized.

One ECC frame 30 is stored in one page or a plurality of pages of the nonvolatile memory 3. In the present embodiment, for example, an LDPC coding scheme is used as a coding scheme for the ECC unit 26. It should be noted that the coding scheme is not limited to the LDPC coding scheme. Various coding schemes may be employed so long as the coding schemes are schemes which can decode using likelihood information, e.g., LLR, such as an LDPC code.

The control unit 23 generally controls the memory system 1. The control unit 23, for example, includes a central processing unit (CPU), a micro processing unit (MPU), or the like, that is programmed or configured to carry out the functions of the control unit 23 described below. When a command is input from the host 4 through the host I/F 21, the control unit 23 performs control according to the command. For example, in a case where the writing request is input from the host 4, the control unit 23 instructs the coding unit 27 (refer to FIG. 3) of the ECC unit 26 to code writing target user data, and also instructs the memory I/F 25 to write a codeword, which is generated by the coding unit 27, to the nonvolatile memory 3. On the other hand, in a case where the reading request is input from the host 4, the control unit 23 instructs the memory I/F 25 to read the codeword from the nonvolatile memory 3, also instructs a decoding unit 28 (refer to FIG. 3) of the ECC unit 26 to decode the codeword that is read from the nonvolatile memory 3. The control unit 23 manages a storage area on the nonvolatile memory 3 (which corresponds to a physical address on the nonvolatile memory 3) of the user data, which is a writing or reading target, for example, using address conversion table or the like.

The random access memory (RAM) 24, for example, is a dynamic RAM (DRAM) or the like, and is used as a working memory when the CPU 23 performs processing. Various management tables, such as firmware for managing a NAND memory 10 and the address conversion table, are loaded into the RAM 24, as necessary.

The buffer memory 22 functions as a memory area which temporarily stores the user data, the write data, the read data, and the like. The buffer memory 22 can be configured with, for example, SDRAM (synchronous DRAM) or static random access memory (SRAM).

In FIG. 1, the configuration is illustrated in which the memory controller 2 includes the ECC unit 26 and the memory I/F 25 as individual components. It should be noted that the present disclosure is not limited to this configuration. Alternatively, the ECC unit 26 may be integrated with the memory I/F 25. In such a case, coding and writing instructions and writing and decoding instructions to the ECC unit 26 and the memory I/F 25 may be combined into single instructions (for example, a writing instruction and a reading instruction), respectively.

Figure 3:
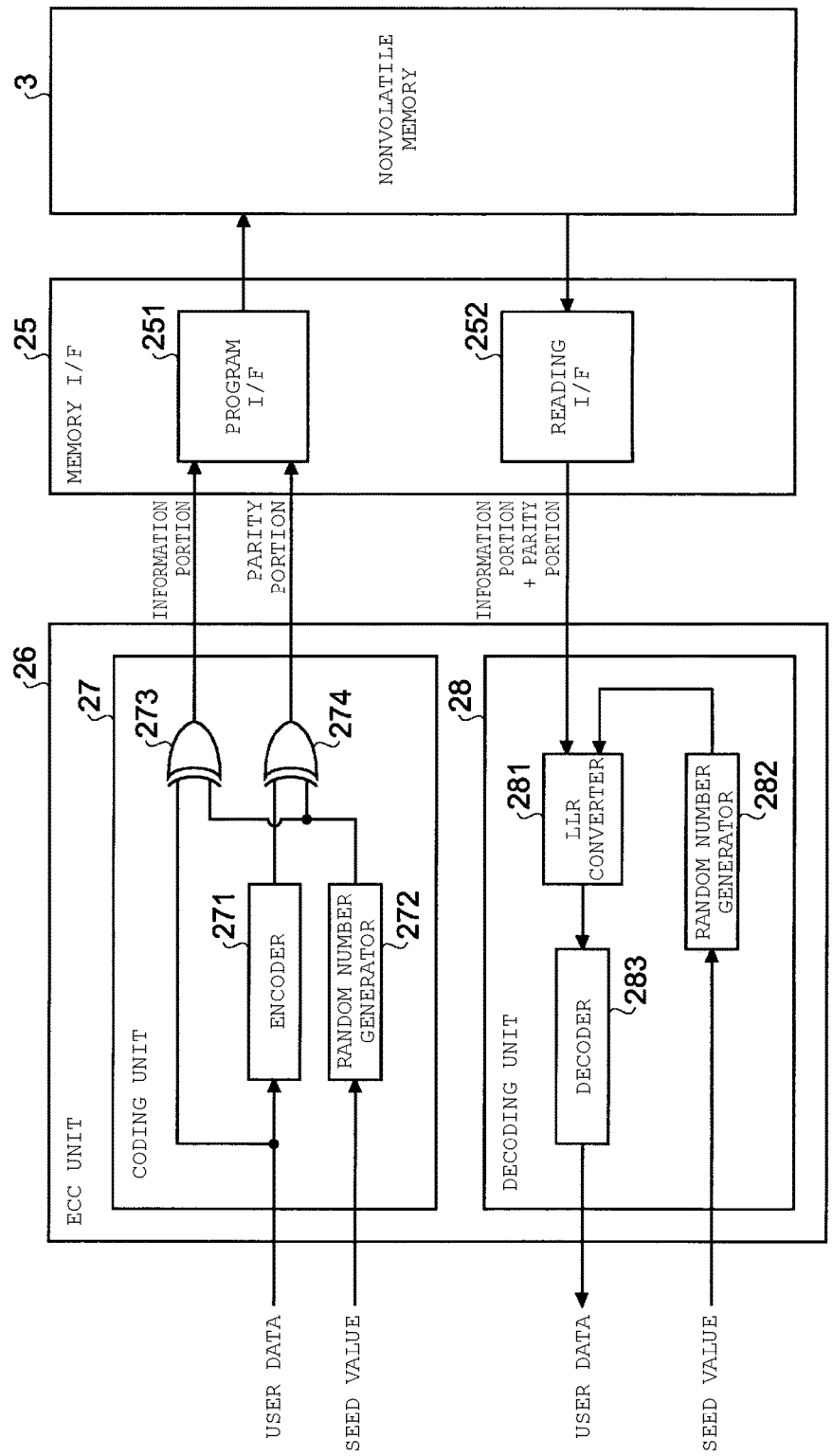
FIG. 3 is a block diagram illustrating an example of a detailed configuration of an ECC unit in the memory system according to the first embodiment, a memory interface, and a semiconductor memory.

The configuration and operation of the ECC unit 26 that is illustrated in FIG. 1 are now described in detail with reference to the drawings. FIG. 3 is a block diagram illustrating an example of a detailed configuration of an ECC unit in the memory system according to the present embodiment, a memory interface, and a nonvolatile memory. Furthermore, FIG. 4 is a flowchart illustrating an example of coding processing according to the present embodiment and FIG. 5 is a flowchart illustrating an example of decoding processing according to the present embodiment.

The ECC unit 26 is a circuit with different units. As illustrated in FIG. 3, the ECC unit 26 includes the coding unit 27 and the decoding unit 28. The coding unit 27 includes an encoder 271, a random number generator 272, and two randomizers, randomizers 273 and 274. The encoder 271 codes the user data that is input, and thus generates the error correction parity. The random number generator 272, for example, is a pseudo-random number generator that includes the LFSR or like, and outputs a pseudo-random number sequence in accordance with a seed value that is input. Each of the randomizers 273 and 274 is an XOR circuit that performs an exclusive OR operation, and obtains an exclusive OR result between two values that are input and outputs a result of the exclusive OR.

The decoding unit 28 includes an LLR converter 281, a random number generator 282, and a decoder 283. Like the random number generator 272 of the coding unit 27, the random number generator 282 is a pseudo-random number generator that, for example, includes an LFSR, and outputs the pseudo-random number sequence in accordance with the seed value that is input. It is noted that instead of having a separate random number generator 282 within the decoding unit 28, the random number generator 272 within the coding unit 27 may be used. Based on a combination of a data value (also referred to as a symbol value) of each of the pieces of read data that are read from the nonvolatile memory 3, and a random number value of each of the pseudo-random number of each of the pseudo-random number sequences that are input from the random number generator 282, the LLR converter 281 obtains an LLR of each symbol of a codeword contained in the ECC frame 30. The decoder 283 decodes the codeword that has been converted into an LLR sequence by the LLR converter 281. As a decoding technique that is used by the decoder 283, various decoding techniques may be employed such as limit distance decoding and a limit repetition decoding.

It is noted that in the present description, the seed value is a value for setting initial states of the random number generators 272 and 282 that generate the pseudo-random number sequence. If the random number generators 272 and 282 are given the identical seed, the random number generators 272 and 282 output the identical pseudo-random number sequence. Furthermore, a seed table is a table in which seed values that are given to the random number generator 272/282 and indices for specifying the seeds are correlated with each other. The seed table is loaded onto the RAM 24 or the buffer memory 22, for example, when the memory system 1 is activated, and is referred to by the control unit 23 so that the same seed used by the coding unit 27 to generate a pseudo-random number sequence for use in generating the codeword can be used by the decoding unit 28 to generate an identical pseudo-random number sequence for use by the LLR converter 281 to convert the codeword into the LLR sequence.

Next, the decoding processing that is performed by the coding unit 27 is described in detail with reference to FIGS. 3 and 4. It is noted that in FIG. 4, focus is placed on operation of the control unit 23.

As illustrated in FIG. 4, in the decoding processing according to the present embodiment, first, the control unit 23 interprets the writing request that is received from the host 4, and specifies a physical address correlated with a logical address which is included in the writing request, for example, from the address conversion table (Step S101). The physical address, for example, may be a head address of a page that is a storage destination in the nonvolatile memory 3, of the writing target user data.

Next, the control unit 23 selects one seed value that is used for generation of a pseudo-random number sequence, from a seed table (not shown) (Step S102). Subsequently, in the writing and reading of the same user data, the control unit 23 stores an index for specifying a seed value which is used when writing in a predetermined area within the RAM 24 or the buffer memory 22 in correlation with, for example, a logical address that is included in the writing request or a physical address that is specified in Step S101 so that a pseudo-random number sequence that is the same as the pseudo-random number sequence that is used for randomizing when writing is generated for randomizing when reading (Step S103).

Next, the control unit 23 instructs the ECC unit 26 to code the user data, and also instructs the memory I/F 25 to write the ECC frame 30, which is generated by the coding, to the nonvolatile memory 3 (Step S104). Thereafter, the control unit 23 ends the present operation. It is noted that in Step S104, the control unit 23 transfers one portion or all portions of the writing target user data that is stored in the buffer memory 22, to the coding unit 27, and also inputs the seed value, which is selected in Step S102, into the coding unit 27.

The user data that is transferred to the coding unit 27, as illustrated in FIG. 3, is input to each of the encoder 271 and the randomizer 273, and the seed value, which is transferred to the coding unit 27, is input to the random number generator 272. The encoder 271 codes the user data that is input, thereby generating the parity, and inputs the generated parity to another randomizer 274. In addition, the random number generator 272 generates the pseudo-random number sequence that is obtained in a predictable manner from the seed value, based on the seed value that is input, and inputs the generated pseudo-random number sequence to the two randomizers, the randomizers 273 and 274.

The randomizer 273 into which the user data and the pseudo-random number sequence are input sequentially calculates the exclusive OR between the user data and the pseudo-random number sequence, one bit at a time. Accordingly, the user data is randomized. Furthermore, the randomizer 273 outputs data that is obtained as a result of the exclusive OR, as the information portion 31 of the ECC frame 30.

In addition, the randomizer 274 into which the parity and the pseudo-random number are input, sequentially calculates the exclusive OR between the parity and the pseudo-random number sequence, one bit at a time. Furthermore, the randomizer 274 outputs the data that is output as a result of the exclusive OR, as the parity portion 32 of the ECC frame 30.

The information portion 31 and the parity portion 32 that are output from the randomizers 273 and 274 are input into a program interface (I/F) 251 in the memory I/F 25. The program I/F 251 links the information portion 31 and the parity portion 32, which are input, to generate the ECC frame 30 (refer to FIG. 2), and writes the ECC frame 30 to a storage area that is designated in the nonvolatile memory 3 (e.g., a page that is designated by the physical address obtained in Step S101).

The decoding processing by the decoding unit 28 is now described in detail with reference to FIGS. 3, 5, and 6. It is noted that in FIG. 5, focus is placed on the operation of the control unit 23.

As illustrated in FIG. 5, in the decoding processing according to the present embodiment, first, the control unit 23 interprets the reading request that is received from the host 4, and specifies the physical address correlated with the logical address which is included in the reading request, for example, from the address conversion table (Step S111).

Next, the control unit 23, for example, specifies an index that is stored in a predetermined area within the RAM 24 or the buffer memory 22 in correlation with the physical address (or the logical address) (Step S112), and acquires the seed value correlated with the specified index from the seed table (Step S113).

Next, the control unit 23 instructs the memory I/F 25 to read the target user data (e.g., the ECC frame 30), and also instructs the ECC unit 26 to decode the ECC frame 30 that is read (Step S114). At that time, the control unit 23 inputs the seed value that is acquired in Step S113, into the ECC unit 26.

At this point, as illustrated in FIG. 3, the seed value that is acquired in Step S113 in FIG. 5 is input to the random number generator 282 in the decoding unit 28. By performing Steps S112 and S113, the seed value is ensured to be the same as the seed value that is used when the target user data was randomized. For this reason, the pseudo-random number sequence that is the same as the pseudo-random number sequence that is used for the randomizing of the target user data is output from the random number generator 282.

Figure 6:
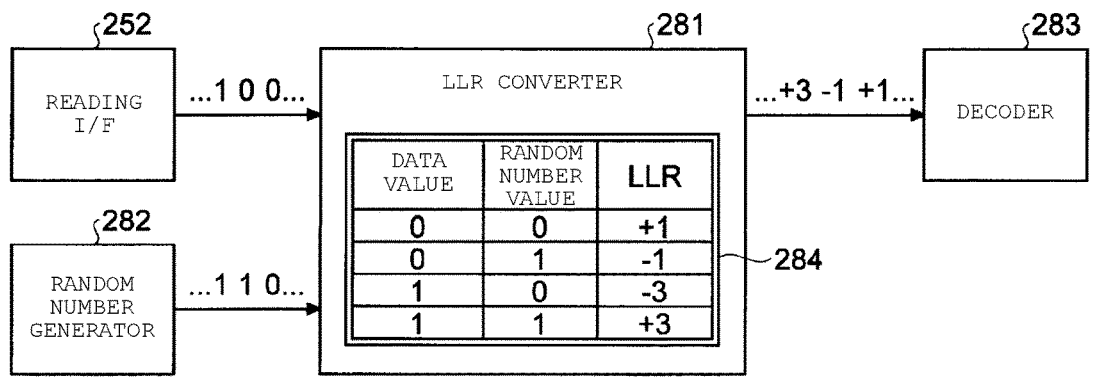
FIG. 6 is a diagram illustrating an example of an LLR conversion table that is provided to an LLR converter according to the first embodiment.

Referring to FIG. 6, the pseudo-random number sequence that is generated by the random number generator 282 is input into the LLR converter 281. The ECC frame 30 that is read from the nonvolatile memory 3 by a reading I/F 252 of the memory I/F 25 input into the LLR converter 281. At this point, an LLR conversion table 284 in which an LLR is correlated with a combination of each data value of the ECC frame 30 and each random number value of the pseudo-random number sequence is provided to the LLR converter 281. The LLR converter 281 specifies the LLR correlated with a combination of a data value of each of the ECC frames 30 that is input and a random number value of each of the pseudo-random number sequences, from the LLR conversion table 284, and outputs the specified LLR sequentially, and thus converts the ECC frame 30 into an LLR sequence. It is noted that the randomizing which was performed to generate the ECC frame 30 is canceled by this LLR conversion.

The LLR sequence obtained by the LLR converter 281 is input to the decoder 283. The decoder 283 performs a soft decision decoding on the LLR sequence, and returns a result of the soft decision decoding to the control unit 23. For example, in a case where the decoding by the decoder 283 succeeds, a notification is provided to the control unit 23 to that effect, and the user data that is restored by this decoding is stored in the buffer memory 22. On the other hand, in a case where the decoding fails, a notification is provided to that effect to the control unit 23.

In this manner, the LLR is obtained from the combination of the data value of each of the ECC frames 30 and the random number value of each of the pseudo-random number sequence. With this configuration, LLR conversion of the ECC frame 30 and the cancellation of the randomizing that is performed on the ECC frame 30 are performed at the same time.

The description is provided with reference again to FIG. 5. The control unit 23 determines whether or not the decoding succeeds, based on the result of the decoding that is notified by the ECC unit 26 (Step S115), and in a case where the decoding succeeds (YES in Step S115), outputs the restored user data, which is stored in the buffer memory 22, to the host 4 (Step S116) and thereafter, ends the present operation. On the other hand, in a case where the decoding fails (NO in Step S115), the control unit 23 returns a reading error to the host 4 (Step S117), and thereafter ends the present operation.

As described above, according to the present embodiment, the parity portion 32, as well as the information portion 31, can be set to a randomizing target. Therefore, the more reliable memory controller, memory system, and control method can be provided.

In the embodiment described above, a configuration in which the LLR is correlated with the combination of the data value of each of the ECC frame 30 that is read from the nonvolatile memory 3 and the random number value of each of the pseudo-random number sequence is given as an example. It should be noted that the present disclosure is not limited to this configuration. For example, a configuration may be employed in which an absolute value of the LLR that corresponds to the data value of each of the ECC frame 30 is determined in advance and in which the random number value is used as information which determines the positiveness and the negativeness of the LLR. Specifically, "3", as an absolute value of the LLR, is correlated with a data value of "1", and "1", as the absolute value of the LLR, is correlated with a data value of "0". In a case where the random number value is "0", a positiveness symbol (+) is given to the absolute value of the LLR, without the data value being reversed when writing. In a case where the random number value is "1", a negative symbol (−) is given to the absolute value of the LLR, with the data value being reversed when writing.

Even with this configuration, the LLR conversion of the ECC frame 30 and the cancellation of the randomizing that is performed on the ECC frame 30 are performed at the same time.

Furthermore, in the present embodiment, the number of LLR conversion tables 284 that are included in the LLR converter 281 is not limited to 1. That is, the LLR converter 281 in the present embodiment may include a plurality of LLR conversion tables, in each of which different LLRs are correlated with combinations of the data value and the random number value, respectively. In such a case, a configuration may be employed in which the LLR converter 281 can suitably change the LLR conversion table that is to be used, according to the frequency with which the decoding by the decoder 283 fails or the total number that reading is performed on each block of the nonvolatile memory 3.

Additionally, in a configuration that is illustrated in FIG. 3, the case where the randomizer 273 for randomizing the information portion 31 and the randomizer 274 for randomizing the parity portion 32 are individually provided is given as an example, but it is also possible that each of the randomizers 273 and 274 is replaced with one shared randomizer. In such a case, a selector that selects any one of the information portion 31 and the parity portion 32, as an input to the randomizer from may be provided. With this configuration, the circuit size of the ECC unit 26 can be reduced.

Furthermore, in the embodiment described above, the same pseudo-random number is generated by using the same seed value when writing and reading, but no limitation to this configuration is imposed. For example, it is also possible that a configuration is employed in which the random number or the pseudo-random number that is generated by the control unit 23 or the random number generator 272 within the coding unit 27 is stored in the RAM 24, the buffer memory 22, or the like, when writing, and in which the stored random number or pseudo-random number is used when reading. Accordingly, because at least the random number generator 282 within the decoding unit 28 can be omitted, the circuit size of the ECC unit 26 can be reduced.

Second Embodiment

In the embodiment described, the case where the ECC frame 30 within the nonvolatile memory 3 is read by performing hard decision reading (which is also referred to as hard bit reading) is given as an example, but no limitation to this is imposed. At this point, in a second embodiment, a case where the ECC frame 30 is read from the nonvolatile memory 3 by performing soft decision reading (which is also referred to as soft bit reading) is described using an example thereof.

Figure 7:
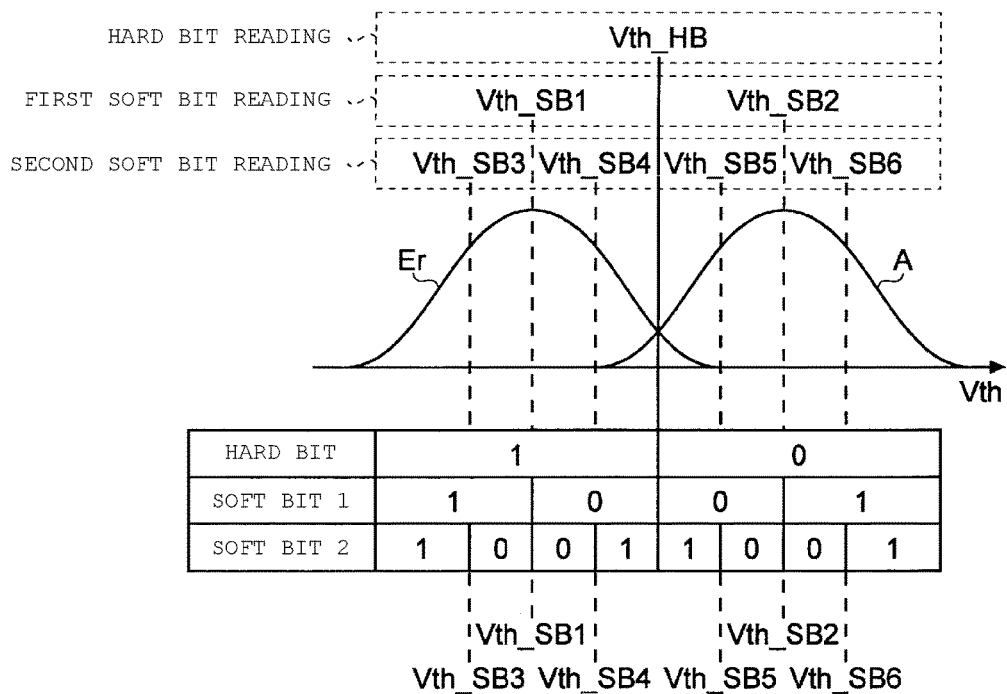
FIG. 7 is a diagram for describing hard bit reading and soft bit reading according to a second embodiment.

First, the hard bit reading and the soft bit reading are described while referring to voltage levels (hereinafter referred to as reading levels) that are used in the reading operations, respectively. FIG. 7 is a diagram for describing the hard bit reading and the soft bit reading according to the embodiment. In FIG. 7, a case where the memory cell is the SLC is illustrated for the brief description. It should be noted that the same may also apply to the MLC, the TLC, and the like.

As illustrated in FIG. 7, in a writing mode in which one-bit data is written to one memory cell (hereinafter referred to as an SLC mode), a threshold voltage of each memory cell belongs to anyone of a low voltage side distribution (this is depicted as an Er distribution) and a high voltage side distribution (this is depicted as an A distribution). The Er distribution and the A distribution can be a Gaussian distribution expressing the frequency (the probability) of the appearance of each threshold voltage. The Er distribution corresponds to a bit value of "1", and the A distribution, for example, corresponds to a bit value of "0".

In order to read "1" and "0" with as a low bit error probability as possible from the two distributions, for example, there is a need to set a reading level to a voltage level that is equivalent to the lowest point of a valley which is formed by overlapping the two distributions. Accordingly, as illustrated in FIG. 7, in the hard bit reading that reads one bit from each memory cell, reading level Vth_HB is set to the vicinity of a voltage that is equivalent to the lowest point.

On the other hand, in the soft bit reading that reads two or more bits from each memory cell, one or more reading levels are set on both sides (lower than and higher than) reading level Vth_HB. In an example that is illustrated in FIG. 7, three reading levels, Vth_SB1, Vth_SB3, and Vth_SB4, are set for the side of the voltage that is lower than reading level Vth_HB that serves as a reference, with a predetermined pitch width of ΔR, and three reading levels, Vth_SB2, Vth_SB5, and Vth_SB6 are set for the high voltage side, with the predetermined pitch width of ΔR.

In the soft bit reading, first, after the hard bit reading that uses reading level Vth_HB is performed, reading that uses reading level Vth_SB1 on the low voltage side and reading that uses reading level Vth_SB2 on the high voltage side are sequentially performed for the first soft bit reading, and thereafter, reading that uses each of reading levels Vth_SB3 to Vth_SB6 is sequentially performed for the second soft bit reading.

When it comes to the first soft bit reading and the second soft bit reading, a bit value that is obtained in each of the first and second bit signal level readings and the hard bit reading, is exclusive-ORed or ANDed. Accordingly, as illustrated in FIG. 7, in addition to the hard bit, two additional soft bits are acquired.

The memory system according to a third embodiment is now described. The memory system according to the third embodiment may have the same configuration as the memory system 1 (refer to FIGS. 1 to 6) that is given as an example in the first embodiment. However, in the present embodiment, the ECC frame 30 that is read from the nonvolatile memory 3 by the reading I/F 252 includes a soft bit. That is, a data value of each of the ECC frames 30 is data that contains two or more bits. For this reason, in the present embodiment, the LLR conversion table 284 that is included in the LLR converter 281 is replaced with an LLR conversion table that has a table structure which corresponds to the number of bits of the data value of each of the ECC frames 30.

FIG. 8 illustrates an example of the LLR conversion table according to the third embodiment. It is noted that FIG. 8 illustrates the example of the LLR conversion table in a case where the number of bits of the data value of each of the ECC frames 30 is in three bits.

As illustrated in FIG. 8, in the LLR conversion table according to the third embodiment, a random number value is combined with each of the three-bit data values, and an LLR is correlated with each of the combinations of the three-bit data value and the random number value. The LLR converter 281 specifies the LLR correlated with a combination if the three-bit data value of each of the ECC frames 30 that is input and the random number value of each of the pseudo-random number sequences, from the LLR conversion table 284 that is illustrated in FIG. 8, and outputs the specified LLR sequentially, and thus converts the ECC frame 30 into the codeword in the LLR sequence.

Even with the configuration described above, in the same manner as in the first embodiment described above, the parity portion 32, as well as the information portion 31, can be set to the randomizing target. Therefore, the reliability can be further improved. Furthermore, by performing the soft bit reading on the nonvolatile memory 3, an amount of information relating to each symbol of the ECC frame 30 is increased. Therefore, high reliable memory system can be provided.

Because other configurations, operations, and effects are the same as in the first embodiments described above, detailed descriptions thereof are omitted here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A memory controller comprising:
   an encoder configured to generate a parity from input data;
   a randomizer circuit configured to generate a first data portion using a first part of a first random number and the input data, and a second data portion using a second part of the first random number and the parity;
   a program interface configured to receive the first data portion and the second data portion from the randomizer circuit and write the first data portion and the second data portion to a nonvolatile memory;
   a reading interface configured to read data from the nonvolatile memory;
   a conversion circuit configured to receive from the reading interface, read data that the reading interface read from the nonvolatile memory, and convert the read data into a log likelihood ratio (LLR) sequence containing a sequence of LLRs, each LLR in the sequence being generated based on a combination of a value of one of the bits of the read data and a value of a corresponding bit of a second random number that is equal to the first random number; and
   a decoder configured to decode the LLR sequence to generate output data corresponding to the input data.

2. The memory controller according to claim 1, wherein during conversion of the read data into the LLR sequence, the conversion circuit accesses a conversion table in which different LLRs are correlated with different combinations of the value of the bits of the read data and the value of the bits of the second random number value.

3. The memory controller according to claim 1, further comprising:
   a first random number generator configured to generate the first random number; and
   a second random number generator configured to generate the second random number.

4. The memory controller according to claim 3, wherein the first random number is a pseudo-random number that is obtained in a predictable manner according to a first seed value that is input into the first random number generator, and
   the second random number is a pseudo-random number that is obtained in a predetermined manner according to a second seed value that is input into the second random number generator, the first seed value being equal to the second seed value.

5. The memory controller according to claim 3,
   wherein each of the first random number generator and the second random number generator includes a linear feedback shift register.

6. The memory controller according to claim 1, wherein the randomizer circuit includes:
   a first XOR circuit configured to receive as inputs the first random number and the input data and generate the first data portion as an output, and
   a second XOR circuit configured to receive as inputs the first random number and the parity and generate the second data portion as an output.

7. The memory controller according to claim 6, wherein the program interface is configured to link the first portion and the second portion and write linked first and second portions as a codeword to the nonvolatile memory.

8. The memory controller according to claim 7, wherein the codeword is a low-density parity-check (LDPC) code.

9. The memory controller according to claim 1, wherein the conversion circuit selects one of a plurality of conversion tables, in each of which different LLRs are correlated with different combinations of the value of the bits of the read data and the value of the bits of the second random number, and
   during conversion of the read data into the LLR sequence, the conversion circuit accesses the selected one of the conversion tables.

10. A memory system comprising a nonvolatile memory, and a memory controller including:
    an encoder configured to generate a parity from input data;
    a randomizer circuit configured to generate a first data portion using a first part of a first random number and the input data, and a second data portion using a second part of the first random number and the parity;
    a program interface configured to receive the first data portion and the second data portion from the randomizer circuit and write the first data portion and the second data portion to a nonvolatile memory;
    a reading interface configured to read data from the nonvolatile memory;
    a conversion circuit configured to receive from the reading interface, read data that the reading interface read from the nonvolatile memory, and convert the read data into a log likelihood ratio (LLR) sequence containing a sequence of LLRs, each LLR in the sequence being generated based on a combination of a value of one of the bits of the read data and a value of a corresponding bit of a second random number that is equal to the first random number; and
    a decoder configured to generate output data corresponding to the input data from the LLR sequence.

11. The memory system according to claim 10, wherein the memory controller further comprises:
    a first random number generator configured to generate the first random number; and
    a second random number generator configured to generate the second random number, wherein
    the second random number is set to be equal to the first random number by inputting a seed value into the second random number generator that is the same as a seed value input into the first random number generator.

12. The memory system according to claim 10, wherein the randomizer circuit includes:
    a first XOR circuit configured to receive as inputs the first random number and the input data and generate the first data portion as an output, and a second XOR circuit configured to receive as inputs the first random number and the parity and generate the second data portion as an output.

13. A control method for use in a memory controller that controls writing and reading of data to and from a nonvolatile memory, the method comprising:

encoding user data to generate a parity;

generating a first data portion using a first part of a first random number and the user data and a second data portion using a second part of the first random number and the parity;

linking the first data portion and the second data portion and writing linked first and second data portions as a codeword to a nonvolatile memory;

reading the codeword from the nonvolatile memory;

converting the codeword into a log likelihood ratio (LLR) sequence containing a sequence of LLRs, each LLR in the LLR sequence being generated based on a combination of a value of one of the bits of the codeword and a value of a corresponding bit of a second random number that is equal to the first random number; and decoding the LLR sequence to restore the user data.

14. The control method according to claim 13, wherein while converting of the codeword into the LLR sequence, accessing a conversion table in which different LLRs are correlated with different combinations of the value of the bits of the codeword and the value of the bits of the random number value.

15. The control method according to claim 13, further comprising:

generating, with a first random number generator, the first random number from a first seed value input into the first random number generator; and generating, with a second random number generator, the second random number from a second seed value input into the second random number generator, the second seed value being equal to the first seed value.

16. The control method according to claim 13, wherein the first data portion is generated using a first XOR circuit, and the second data portion is generated using a second XOR circuit.

* * * * *